United States Patent [19]

Giebel et al.

[11] Patent Number: 4,803,657

[45] Date of Patent: Feb. 7, 1989

[54] SERIAL FIRST-IN-FIRST-OUT (FIFO) MEMORY AND METHOD FOR CLOCKING THE SAME

[75] Inventors: Burkhard Giebel, Denzlingen; Ulrich Theus, Gundelfingen, both of Fed. Rep. of Germany

[73] Assignee: Deutsche ITT Industries GmbH, Freiburg, Fed. Rep. of Germany

[21] Appl. No.: 43,384

[22] Filed: Apr. 28, 1987

[30] Foreign Application Priority Data

May 2, 1986 [EP] European Pat. Off. ........ 86106049.9

[51] Int. Cl.$^4$ ............................................. G11C 19/28
[52] U.S. Cl. .................................. 365/221; 365/233; 377/79
[58] Field of Search ............... 365/221, 219, 230, 233, 365/189, 78, 239, 240; 377/77, 78, 79, 80

[56] References Cited

U.S. PATENT DOCUMENTS 3,704,452  11/1972  Beausoleil et al. ................... 365/78
3,708,690   1/1973  Paivinen ............................. 307/221

FOREIGN PATENT DOCUMENTS 2212703  7/1974  France .
2236249  1/1975  France .

OTHER PUBLICATIONS

Nahata et al, "General Purpose Bit Shifter", IBM Technical Disclosure Bulletin, vol. 24, No. 10, Mar. 1982, pp. 5057-5060.

*Primary Examiner*—Stuart N. Hecker
*Assistant Examiner*—Glenn A. Gossage
*Attorney, Agent, or Firm*—Thomas L. Peterson

[57] ABSTRACT

A delay line digital memory is organized into n signal branches ($z_1 \ldots z_n$), each with m cells which form a serial data or signal flow path. Each cell is comprised of a transfer transistor t with a subsequently following level restorer, regenerator, or buffer circuit p which, however, is omitted in the last cell. Furthermore, n clock signals ($s_1 \ldots s_n$) are provided whose frequency (or repetition rate) equals one n-th of the data rate of the digital input signals, and whose effective pulses follow each other in temporal serial succession within one period of the data rate. Clocking (or activation) by clock signals ($s_1 \ldots s_n$) is chosen so that in the first signal branch ($z_1$) the first transistor is fed with the last clock signal ($s_n$); in the second signal branch, the first transistor is fed with the next to last clock signal ($s_{n-1}$); in the next to last signal branch ($z_{n-1}$), the first transistor is fed with the second clock signal ($s_2$); and in the 1st signal branch ($z_n$) the first transistor is fed with the first clock signal ($s_1$) at its gate. The remaining transistors of each signal branch are then fed in the sense of a descending clock-signal numbering order. Both the inputs and outputs of the signal branches are assembled or led together to either the signal input ($s_e$) or the signal output ($s_a$). This arrangement results in a considerable saving of space in the case of a monolithic integration compared to the cases in which shift registers or dynamic random access memories (DRAMs) are employed. The effective length of the storage time can be reduced in increments corresponding to the magnitude of the period of the data rate of the input signal.

5 Claims, 3 Drawing Sheets

SERIAL FIRST-IN-FIRST-OUT (FIFO) MEMORY AND METHOD FOR CLOCKING THE SAME

BACKGROUND OF THE INVENTION

1. Field of the Invention

The present invention relates to a digital serial FIFO semiconductor memory.

2. Description of the Prior Art

A similar arrangement of transfer transistors is described in the German Offenlegungsschrift DE-A No. 24, 30 349, as part of a memory designed in accordance with the charge-transfer principle, and more particularly in accordance with the bucketbrigade principle, with the signal branches therein being referred to as transversal chains. The inputs of the signal branches and the outputs thereof are respectively connected to the tapping points of two further series of transfer transistors, which, in the aforementioned German Offenlegungsschrift are referred to as longitudinal chains. These are each independently clocked by separate clock signals as is characteristic for operation based upon the charge-transfer principle. The arrangement as described hereinbefore is suitable in particular for storing and, consequently, also for delaying analog signals or in a limiting case purely digital signals.

If digital signals are to be stored and, consequently, delayed in the sense of the first-in-first-out (FIFO) principle, it appears that the arrangement as described hereinbefore is too expensive with regard to the amount of semiconductor surface required for realizing the intended integrated circut, especially since each transfer transistor, in the arrangement as described hereinbefore, must be accompanied by a capacitor which likewise requires a certain surface area.

Therefore, it is the object of the invention that by utilizing parallel signal branches in the arrangement as described hereinbefore, a more space-saving arrangement can be provided which is suitable for use as a serial FIFO memory for digital signals.

Actually, FIFO memories can be realized with the aid of the well known dynamic random access memories (DRAMs). These, however, require suitable addressing. Moreover, up to a memory size of about 5 kilobits, the required semiconductor surface area, owing to the considerable proportion of so-called overheads, is so large that suitable loopholes have to be looked for. Overheads include all those partial circuits which are required in addition to the actual memory cells and are necessary for ensuring the safe operation thereof, such as the so-called dummy cells, the addressing and precharging stages for the bit and word lines, the write and read amplifier, the input and output buffer circuits, and etc.

Shift registers have also already been used in connection with FIFO memories, because they do not have the aforementioned disadvantage of overheads. The clock signal of the shift register, however, is required to have a frequency which is equal to that of the data rate of the input signals. This leads to rather considerable power losses in the shift register in the case of high clock frequencies.

In distinction to the foregoing, the power or dissipation loss occurring in the invention, owing to the clock signal frequency being reduced by the factor of n in the parallel signal branches, is reduced to about one n-th of the loss occurring in a usual type of shift register, with n indicating the number of parallel signal branches and, at the same time, the number of clock signals required for the total arrangement. Furthermore, for a conventional shift-register cell which, even in dynamic MOS circuits, consists of at least six transistors, there corresponds only one transfer transistor in the invention with its associated level regenerator, with this, for example, merely requiring three transistors.

The invention will now be explained in greater detail with reference to the accompanying drawings.

BRIEF SUMMARY OF THE INVENTION

The invention is a serial FIFO memory comprising insulated-gate, field-effect transistors of the same conductivity and control type, e.g. N-channel enhancement transistors, as well as n signal branches which extend in a parallel signal flow, with the inputs thereof being coupled to the input of a memory, and with the outputs thereof being coupled to the output of the memory, with each signal branch containing m transfer transistors whose source-drain sections are arranged in a series signal flow, and with the gates of the transfer transistors of each signal branch being clocked with clock signals whose effective pulses, in direction from the m-th to the first transfer transistor, are in such a timely succession that the transistors are rendered conductive one at a time in turn.

More specifically the invention is an improvement in a serial FIFO memory comprising a plurality of insulated-gate field-effect transistors of the same conductivity and control type. Each transistor has an input and output. The plurality of transistors is arranged and configured into n signal branches ($z_1 \ldots z_n$) which comprise parallel signal paths. The inputs thereof are coupled to an input ($s_e$) of the memory. The outputs thereof are coupled to an output ($s_a$) of the memory. Each signal branch is comprised of m transfer transistors. Each transistor has a source-drain section arranged in a series signal path for transmitting therethrough input signals having a predetermined data rate. Each transistor has a gate which is supplied with a clock signal. The effective pulses are in such a timely succession that the transistors are rendered conductive one at a time in turn in a direction from the m-th to the first transfer transistor in each branch.

The improvement comprises the features wherein the memory exclusively serves as a memory for digital signals, wherein the number of clock signals equals n, and their repetition rate equals one n-th of the data rate of the input signals. With respect to the m transfer transistors in each signal branch, the following clocking protocol is observed.

In the first signal branch ($z_1$), the first, the $(n+1)$th, the $(2n+1)$th, ... and the $(qn+1)$th transfer transistor are clocked by the n-th clock signal ($s_n$). The second, the $(n+2)$th, the $(2n+2)$th ... and the $(qn+2)$th transfer transistor are clocked by the $(n-1)$th clock signal ($s_{n-1}$), and so forth in an identical pattern for each remaining transfer transistor and clock signal until the n-th, the 2n-th, the 3n-th ... the qn-th transfer transistor is clocked by the first clock signal ($s_1$).

In the second signal branch ($z_2$) the first, the $(n+1)$th, the $(2n+1)$th ... and the $(qn+1)$th transfer transistor are clocked by the $(n-1)$th clock signal ($s_{n-1}$). The second, the $(n+2)$th, the $(2n+2)$th, ... and the $(qn+2)$th transfer transistor are clocked by the $(n-2)$th clock signal and so forth in an identical pattern for each remaining transfer transistor and clock signal until the n-th, the 2n-th, the 3n-th, . . . the qn-th transfer transistor are clocked by the n-th clock signal.

The clocking protocol continues in an identical pattern for each remaining signal branch until in the last signal branch ($z_n$) where the first, the (n+1)th, the (2n+1)th, . . . and the (qn+1)th transfer transistor are clocked by the first clock signal ($s_1$). The second, the (n+2)th. the (2n+2)th . . . the (qn+2)th transfer transistor are clocked by the n-th clock signal ($s_n$), and so forth in an identical pattern for each remaining transfer transistor and clock signal until the n-th, the 2n-th, the 3n-th, . . . and the 8n-th transfer transistor are clocked by the second clock signal. The quantity q indicates the number of complete blocks consisting of n times n transfer transistors as counted from the signal input.

Each signal branch level generator or buffer (p) is connected to the output of the source-drain section of each transfer transistor except the m-th one.

The inputs of the signal branches are directly applied to the signal input ($s_c$) and the outputs thereof are directly applied to the signal output ($s_a$).

In another embodiment the improvement further comprises a plurality of further identical cells. In each of the signal branches ($z_1 \ldots z_n$) the first cell is preceded by the further identical cell. The first, the second, . . . and the n-th clock signal ($s_1 \ldots s_n$), is applied to the gate of the corresponding transfer transistor in these additional cells. The first cell of the last signal branch ($z_n$) contains no transfer transistor. In the first signal branch ($s_1$) the one but last cell contains no transfer transistor. In the case of a remaining block (R) of r times n transfer transistors (where r is less than n), the (n−r+2)th clock signal ($s_{n-r+2}$) is applied to the gate of the last transfer transistor of the remaining block (R). In the one but last signal branch ($z_{n-1}$), the (n-r)th clock signal ($s_{n-r}$) is applied to the gate of the last transfer transistor of the remaining block (R). In the last signal branch ($z_n$) the (n−r+1)th clock signal ($s_{n-r+1}$) is applied to the last transfer transistor of the remaining block (R).

In yet another embodiment the improvement further comprises a plurality, x, of interfaces ($S_x$) which each lie between two neighboring cells which are each clocked by a clock signal of consecutive numbering order. For each interface ($S_x$) the numbering cycle of the clock signals for the cells lying downstream in the signal-flow path begins with the clock signal differing by −w from those clock signals which are applied to the cells lying directly upstream in the signal flow path of the interface. The quantity w is selectable between 1 and n−2, and is equal to the number of periods of the data rate by which the storage time of the FIFO memory is reduced at the respective interface.

In still another embodiment the improvement includes only one interface, and the numbering order difference of the clock signals at this particular interface equals w.

The invention and its various embodiments are better understood by considering the following drawings wherein like elements are referenced by like numerals.

BRIEF DESCRIPTION OF THE DRAWINGS

FIG. 1a defines the symbolic depiction for a combination of transfer transistors t and p as utilized in FIG. 1.

FIG. 1b defines the symbolic depiction for transfer transistor t as utilized in FIG. 1.

FIG. 3a defines the symbol used for the combination of transfer transistors t and p utilized in FIG. 3.

FIG. 3b defines the symbol used for transfer transistor t utilized in FIG. 3.

DETAILED DESCRIPTION OF THE PREFERRED EMBODIMENT

A delay line digital memory is organized into n signal branches ($z_1 \ldots z_n$), each with m cells which form a serial data or signal flow path. Each cell is comprised of a transfer transistor t with a subsequently following level restorer, regenerator, or buffer circuit p which, however, is omitted in the last cell. Furthermore, n clock signals ($s_1 \ldots s_n$) are provided whose frequency (or repetition rate) equals one n-th of the data rate of the digital input signals, and whose effective pulses follow each other in temporal serial succession within one period of the data rate. Clocking (or activation) by clock signals ($s_1 \ldots s_n$) is chosen so that in the first signal branch ($z_1$) the first transistor is fed with the last clock signal ($s_n$); in the second signal branch, the first transistor is fed with the next to last clock signal ($s_{n-1}$); in the next to last signal branch ($z_{n-1}$), the first transistor is fed with the second clock signal ($s_2$); and in the last signal branch ($z_n$) the first transistor is fed with the first clock signal ($s_1$) at its gate. The remaining transistors of each signal branch are then fed in the sense of a descending clock-signal numbering order. Both the inputs and outputs of the signal branches are assembled or led together to either the signal input ($s_e$) or the signal output ($s_a$). This arrangement results in a considerable saving of space in the case of a monolithic integration compared to the cases in which shift registers or dynamic random access memories (DRAMs) are employed. The effective length of the storage time can be reduced in increments corresponding to the magnitude of the period of the data rate of the input signal.

Figure 1:
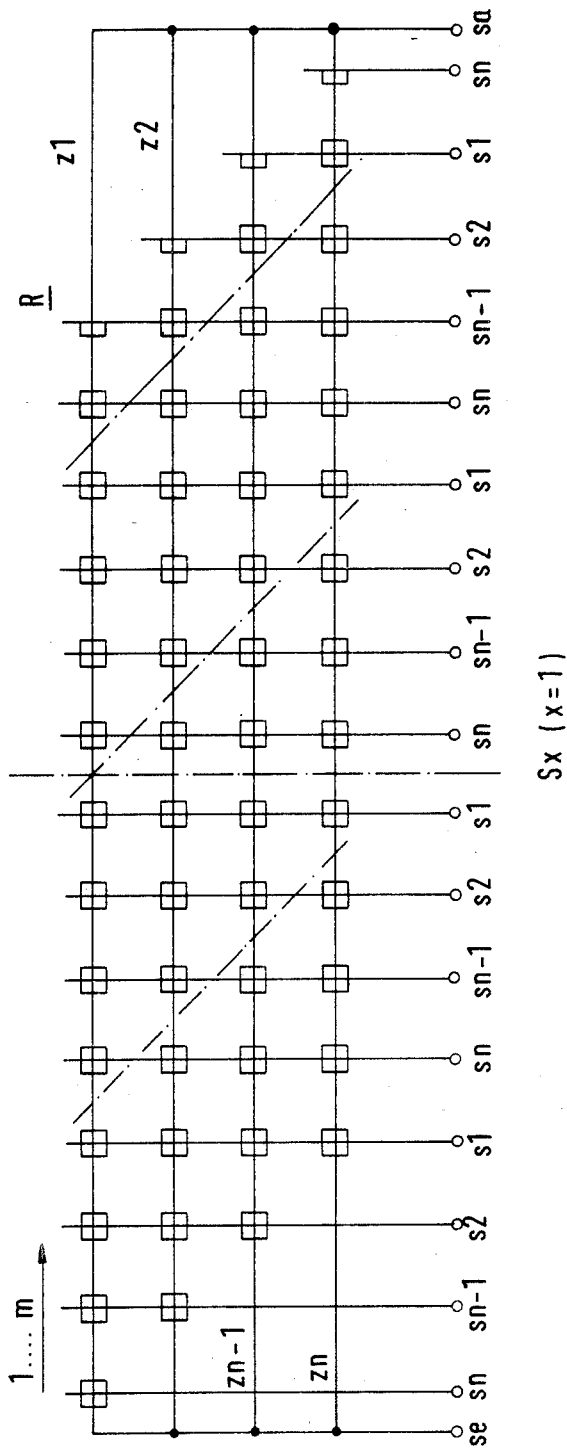
FIG. 1 is a highly schematized representation showing the circuit diagram of one embodiment of the invention.

In the highly schematized circuit diagram of FIG. 1, parallel signal branches $z_1$, $z_2$, $z_{n-1}$ and $z_n$ of n such branches are illustrated, with each signal branch comprising m transfer transistors t which, with the exception of the m-th one, is followed by a level regenerator p, which are symbolically depicted in FIG. 1 and illustratively shown in FIG. 1a. Both the transfer transistor t and the level regenerator p, for simplicity, are shown in FIG. 1 as a small square and are hereinafter referred to as cells which, for the sake of clarity, will not be numbered. Transfer transistors t are schematically denoted in FIG. 1a as the left-hand half of the aforementioned square as shown in FIG. 1a.

Unlike prior art systems, in which the number of clock signals corresponds to the number of transfer transistors per signal branch, and in which equipositioned transistors in the individual signal branches are activated by the same clock signal, (for example all first transfer transistors by the last clock signal and all last transfer transistors by the first clock signal), the invention provides only so many clock signals $s_1$, $s_2$, $s_{n-1}$ and $s_n$ as correspond to the number n of the signal branches $z_1 \ldots z_n$.

Moreover, in the invention, the application of these clock signals to the transfer transistors t of the signal branch is effected by staggering in the direction of the descending numbering of the clock signals. Thus, in the first signal branch $z_1$, the first and the $jn+1$th transistor, for $j=1, 2, 3, \ldots$, are each activated by n-th clock signal $s_n$, hence, apart from the first one also the $(n+1)$st transistor, the $(2n+1)$st transistor and the $(3n+1)$st transfer transistor and so forth. In the illustration of FIG. 1, $n=4$, these are then the first, the fifth, the ninth and the thirteenth transfer transistors.

If q were to indicate the number of complete blocks consisting of n times n transfer transistors as counted from the signal input then, in FIG. 1, $q=3$, and the aforementioned ninth transistor becomes the $(qn+1)$st transistor. The thirteenth transistor, as mentioned hereinbefore, as well as the fourteenth transistor following it, will then belong to the remaining block R of r times n transfer transistors, in which case r is less than n: r n.

If in the second signal branch $z_2$, according to the invention, the first transfer transistor is activated or clocked by the $(n-1)$st clock signal $s_{n-1}$, and likewise again the corresponding transfer transistors which are n, 2n, ... qn, in the direction of signal flow downstream from the first transistor. In the next to last signal branch $z_{n-1}$ the first transfer transistor and likewise the associated transfer transistors which are n, 2n, ... qn downstream from it, are clocked or activated by the second clock signal $s_2$. In the last signal branch $z_n$, the first transfer transistor and the further ones corresponding to it are clocked or activated by the first clock signal $s_1$.

In the first signal branch $z_1$ the second transfer transistor and likewise also the other transfer transistors which are distant therefrom by n, 2n ... qn, are clocked by the one but last clock signal $s_{n-1}$. In the second signal branch $z_2$ the second transfer transistor, etc., are clocked by the second clock signal $s_2$. In the one but last signal branch $z_{n-1}$, the second transfer transistor, etc., are clocked by the first clock signal $s_1$, and in the last signal branch $z_n$, the second transfer transistor etc., are clocked by the last clock signal $s_n$.

In FIG. 1 this "staggered" clockwise clocking or activating scheme is expressed by the fact that the transistors of the signal branches are staggered by respectively one clock number with respect to those of the signal branch lying above them. Hence, below the fourth transfer transistor of the signal branch $z_1$, there is the third one of the second signal branch $z_2$, the second one of the one but last signal branch $z_{n-1}$, and the first one of the last signal branch $z_n$.

A further essential feature of the invention resides in that the frequency of the clock signals $s_1 \ldots s_n$ is equal to one n-th of the data rate of the input signals as applied to the signal input $s_e$. For this purpose the inputs of the individual signal branches are assembled to form the signal input $s_e$. Thus, compared to the prior art arrangement described hereinbefore, the aforementioned input-sided longitudinal chain may be omitted.

Moreover, the output-sided longitudinal chain is also omitted, because the individual outputs of the signal branches $z_1 \ldots z_n$ are assembled to form the signal output $s_a$ of the FIFO memory.

In the likewise aforementioned remaining block R, the clocking of the individual transfer transistors of the signal branches is carried out in accoradance with the scheme as already explained. Since, in the example of the embodiment as shown in FIG. 1, the remaining block R contains $r=2$ transistors, for instance, the two last transistors of the last signal branch $z_n$ are clocked by the first or the last clock signal $s_1$ or $s_n$, respectively.

Figure 2:
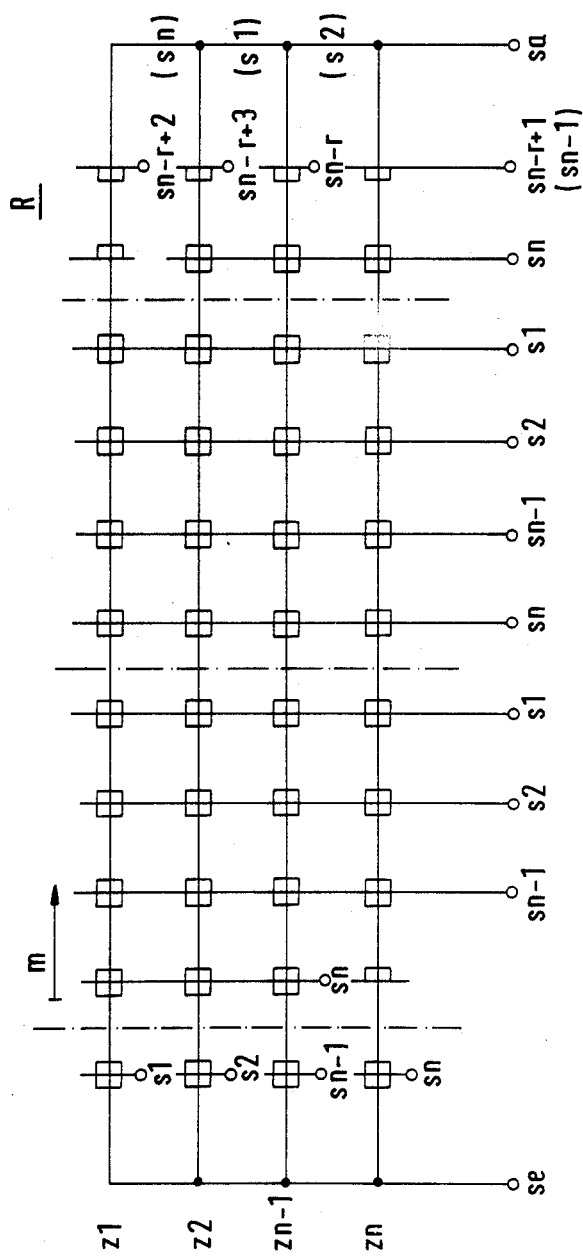
FIG. 2 is a highly schematized representation showing a modification of the memory according to the invention.
Figure 2A:
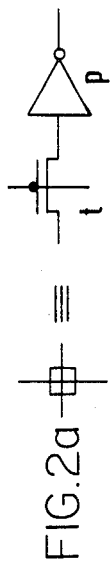
FIG. 2a defines the symbol used for the combination of transfer transistors t and p as utilized in FIG. 2.
Figure 2B:
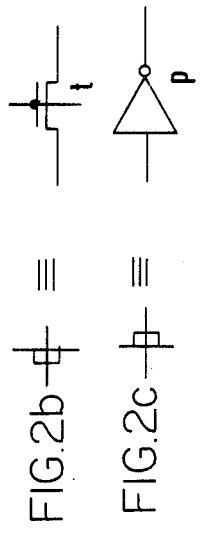
FIG. 2b defines the symbol used for transfer transistor t as utilized in FIG. 2.
Figure 2C:
FIG. 2c defines the symbol used for converter transistors p utilized in FIG. 2.

FIG. 2 shows a modification of the arrangement as shown in FIG. 1 in which, and unlike the arrangement of FIG. 1, the clock signals are applied differently.

In particular, in all of the signal branches $z_1 \ldots z_n$, the respective first cell is preceded by a further cell in which a clock signal corresponding to the branch is coupled to the gate of the transfer transistor. For example, in the first signal branch $z_1$, the first clock signal $s_1$ is fed to the gate of the respective transfer transistor. In the second signal branch $z_2$ the second clock signal $s_2$ is fed to the gate of the transfer transistor in the further cell. In the next to last signal branch $z_{n-1}$, the next to last clock signal $s_{n-1}$ is fed thereto, and in the last signal branch $z_n$, the last clock signal $s_n$ is fed to the gate. In the last signal branch $z_n$, the first transter transistor is omitted, so that merely a nonclocked level regenerator exists in the first cell. In FIG. 2 this is graphically illustrated by the fact that only the right-hand half of the symbolic square is drawn.

Also a modification of the output has been effected as compared to the arrangement as shown in FIG. 1, i.e., a different clock signal is fed as to the gate of the last transfer transistor of the remaining block R than in FIG. 1. In particular, in the first signal branch $z_1$ the one but last transfer transistor has been omitted, so that only the level regenerator exists in the one but last cell. In the case of a remaining block R, consisting of r times n transfer transistors (r less than n), and in accordance with the modification proposed by the invention, the $(n-r+2)$th clock signal $s_{n-r+2}$ is applied to the gate of the last transfer transistor.

In the second signal branch $z_2$ the last transfer transistor is clocked by the $(n-r+3)$th clock signal $s_{n-r+3}$, in the one but last signal branch $z_{n-1}$ by the $(n-r)$th clock signal $s_{n-r}$, and in the last branch $z_n$ by the $(n-r+1)$th clock signal $s_{n-r+1}$. Since, in the example of the embodiment of the modification according to FIG. 2, $n=4$ and $r=2$, and because the sum $n-r+\ldots$, in the case of results which are greater than n, is to be diminished by n, the last transfer transistor in the first signal branch $z_1$ is clocked by the last clock signal $s_n$; in the one but last signal branch $z_{n-1}$ by the second clock signal $s_2$; and in the last signal branch $z_n$ by the one but last clock signal $s_{n-1}$. In FIG. 2 these clock signals are shown in brackets.

The slanting or vertical dashed lines in FIGS. 1 and 2 respectively indicate the aforementioned blocks of n times n cells. From FIG. 2 it can be seen that in this particular embodiment, the blocks can be arranged in squares, while in FIG. 1 they are rhombic. For the layout of an integrated circuit, therefore, the arrangement according to FIG. 2 is generally more favorable.

The most simple type of inverter available in the chosen technology is used as a level regenerator p. When realizing the transfer transistors as N-channel enhancement type MOS transistors, a so-called depletion-load inverter is preferably used. Hence an inverter whose switching transistor is again an enhancement-type, and whose load transistor is a depletion-type transistor is employed.

However, it is also possible to use as the level regenerator, an arrangement consisting of three transistors whose switching sections are arranged in series, i.e., of the type as has been disclosed on pages 999 to 1007, especially in FIG. 7 of the "IEEE Journal of Solid-State Circuits, 1984. In that case the two overlapping clock signals required for such a state are to be produced from the respective clock signal $s_1 \ldots s_n$.

Figure 3:
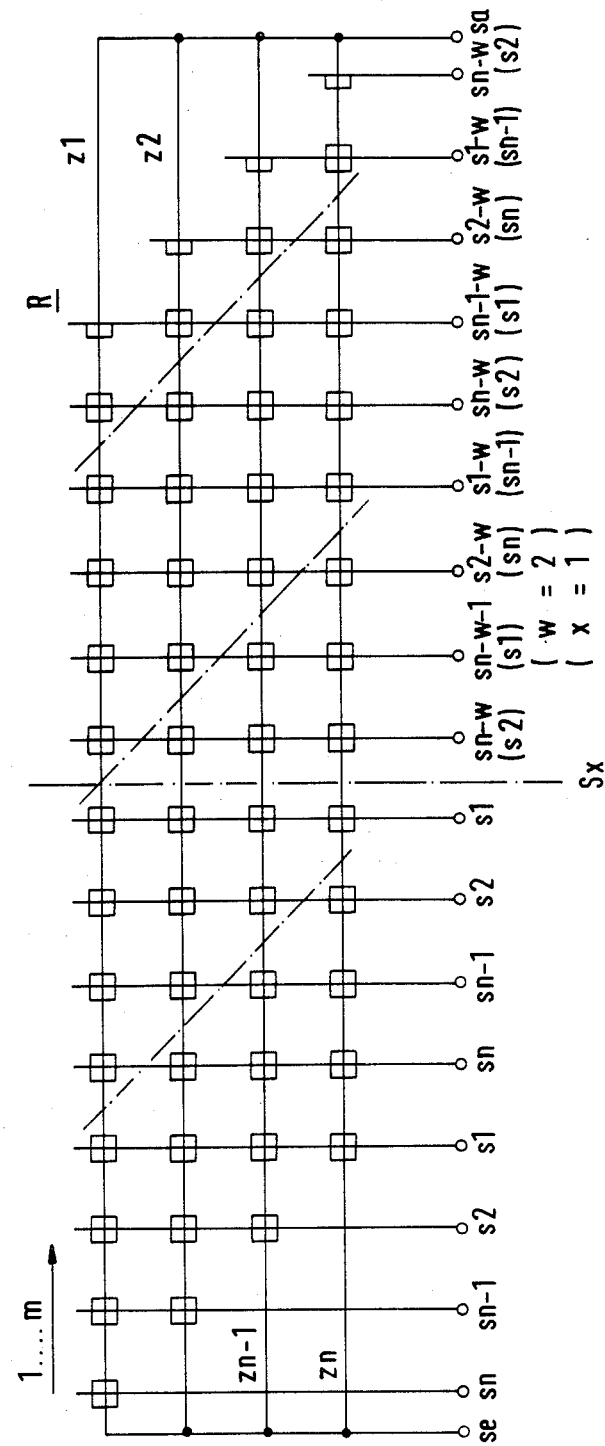
FIG. 3 shows a memory according to FIG. 1 with a reduced storage time.

FIG. 3 shows an arrangement which corresponds to that of FIG. 1 in which, by differently applying the clock signals to the cells, the possible maximum storage time is reduced in multiples of the data rate period of duration. This is accomplished with x interfaces $S_x$ which respectively lie between two neighboring cells, each clocked by a clock signal of successively following or consecutive numbering order. In FIG. 1 the interface $S_x$ is shown to lie between the cells to which the clock signals $s_1$, $s_n$ are applied. In FIG. 3, clock signals are shown to be applied to the cells lying on the right of the interface $S_x$ with the numbering cycle of the pulses starting with $s_{n-w}$ at the cells directly bordering on the interface $S_x$, with w being selectable between 1 and $W=n-2$; w also indicates the number of periodic durations of the data rate by which the storage time is reduced to the interface $S_x$. For $w=2$ the corresponding numbering is stated in brackets, in FIG. 3, in addition to the general clock-signal numbering.

For each interface $S_x$, w is selectable within the stated limits. Thus, there results a total reduction of the delay in data rate-period duration-units which is equal to the sum over w. This will be more easily understood with reference to an example:

A FIFO memory can be assumed to have $n=8$ signal branches, each with $m=20$ cells. Six interfaces can be assumed to exist, for which the following is supposed to be applicable: $w1=1$, $w2=2$, $w3=3$, $w4=4$ and $w5=5$. In that case the sum over w equals 15.

Therefore, the numbering cycle can be changed in such a way that $s_n$ is directly followed by $s_{n+1}$. The retention time of the shifted signal is then reduced to one period of duration of the data rate. According to FIG. 3, an interface must always lye between completely embodied cells in all of the signal branches. Therefore, a configuration according to FIG. 2 lends itself to such a reduced FIFO memory. Interfaces may be provided for simultaneity at all of the available points. Care has to be taken since the switching-speed required of the cells increases as the retention time of the signal is reduced.

If FIFO memory is to be provided with this possibility or reducing the storage time, electronic changeover switches may be provided, e.g., behind the one or more interfaces, which as already explained change the cycles of all clock signals which must be applied behind the interface. It is assumed relative thereto that respectively one of the n outputs of a clock signal generator feeds all terminals of corresponding numbering order, that is, terminals of the same or identical numbering are also connected among each other.

It may be still more advantageous, however, to provide a clock signal generator which, for each clock-signal input of the FIFO memory, produces a separate clock signal, with the clock signals of same numbering order being in phase with each other, so that the pulses appear simultaneously for all clock-signal inputs. In the case of such a clock-signal generator (oscillator), the explained reduction of the storage time at an interface $S_x$ can be accomplished in a very simple way by providing for a corresponding delay of the clock signals in the clock-signal generator.

If, for example, this generator is an m-stage shift register in which a signal pattern rotates from the end to the beginning, which is determined by n stages marked at a spacing of $n-1$, then the clock signals behind the interface $S_x$ are to be taken off the shift-register stages as staggered by w.

Many modifications and alterations may be made by those having ordinary skill in the art without departing from the spirit and scope of the invention. Thus, the illustrated embodiment has been set forth only for the purposes of example and should not be read as limiting the invention which is defined by the following claims.

We claim:

1. An improvement in a serial FIFO memory comprising a plurality of insulated-gate field-effect transistors of the same conductivity and control type, each having an input and output, said plurality of transistors being arranged and configured into n signal branches ($z_1 \ldots z_n$), each with m cells, which comprise parallel signal paths, the inputs thereof being coupled to a signal input ($s_e$) of said memory and the outputs thereof being coupled to a signal output ($s_a$) of said memory, each signal branch comprising m transfer transistors, each having a source-drain section arranged in a series signal path for transmitting therethrough input signals having a predetermined data rate, a gate of each of the transfer transistors in each signal branch being supplied with clock signals whose effective pulses, in direction from the m-th to the first transfer transistor in each branch, are in such a timely succession that the transistors are rendered conductive one at a time in turn, said improvement comprising:

wherein said memory exclusively serves as a memory for digital signals;

wherein the number of clock signals equals n, and their repetition rate equals one n-th of said data rate of said input signals;

wherein of said m transfer transistors in each signal branch:

in the first signal branch ($z_1$), the first, the (n+1)th, the (2n+1)th, ..., and the (qn+1)th transfer transistors are clocked by the n-th clock signal ($s_n$), the second, the (n+2)th, the (2n+2)th, ..., and the (qn+2)th transfer transistors are clocked by the (n−1)th clock signal ($s_{n-1}$), and so forth in an identical pattern for each remaining transfer transistor and clock signal until the n-th, the 2n-th, the 3n-th, ..., and the qn-th transfer transistors are clocked by the first clock signal ($s_1$), in the second signal branch ($x_2$)

the first, the (n+1)th, the (2n+1)th, ..., and the (qn+1)th transfer transistors are clocked by the (n−1)th clock signal ($s_{n-1}$), the second, the (n+2)th, the (2n+2)th, ..., and the (qn+2)th transfer transistors are clocked by the (n=2)th clock signal and so forth in an identical pattern for each remaining transfer transistor and clock signal until the n-th, the 2n-th, the 3n-th, ..., and the qn-th transfer transistors are clocked by the n-th clock signal, and continuing in an identical pattern for each remaining signal branch until in the last signal branch ($z_n$)

the first, the (n+1)th, the (2n+1)th, ..., and the (qn+1)th transfer transistors are clocked by the first clock signal ($s_1$), the second, the (n+2)th, the (2n+2)th, ..., and the (qn+2)th transfer transistors are clocked by the n-th clock signal ($s_n$), and so forth in an identical pattern for each remaining transfer transistor and clock signal until the n-th, the 2n-th, the 3n-th, ..., and the qn-th transfer transistors are clocked by the second clock signal, with q indicating the number of complete blocks consisting of n times n transfer transistors as counted from the signal input, and where in each signal branch, a level generator (p) is connected to the output of the source-drain section of each transfer transistor except the m-th one; and wherein said inputs of said signal branches are directly applied to said signal input ($s_e$) and said outputs thereof are directly applied to said signal output ($s_a$).

2. The improvement of claim 1 further comprising:
a plurality of further identical cells, in each of said signal branches ($z_1 \ldots z_n$), a respective first cell is preceded by a corresponding further identical cell, in which further cells said first, said second, ..., and said n-th clock signals ($s_1 \ldots s_n$), are applied to gates of corresponding transfer transistors;
wherein the first cell of the last signal branch ($z_n$) contains no transfer transistor;
wherein in the first signal branch ($s_1$), the next to last cell contains no transfer transistor, and in the case of a remaining block (R) of r times n transfer transistors (where r is less than n), the (n−r+2)th clock signal ($s_{n-r+2}$) is applied to the gate of the last transfer transistor of the remaining block (R);
wherein in the next to last signal branch ($z_{n-1}$), the (n-r)th clock signal ($s_{n-r}$) is applied to the gate of the last transfer transistor of the remaining block (R); and
wherein the last signal branch ($z_n$), the (n−r+1)th clock signal ($s_{n-r+1}$) is applied to the last transfer transistor of said remaining block (R).

3. The improvement of claim 2 further comprising:
a plurality, x, of interfaces ($S_x$), each interface ($S_x$) lying between two neighboring cells (e,g,z1,z2) each clocked by a clock signal of consecutive numbering order; and
for each interface ($S_x$), the numbering cycle of the clock signals for the cells lying downstream in the signal-flow path begins with the clock signal differing by w from those clock signals which are applied to the cells lying directly upstream in the signal flow path of the interface, with w being selectable between 1 and W=n−2, and equal to the number of periods of said data rate, appearing per interface, by which the storage time of the FIFO memory is reduced at the respective interface.

4. The improvement of claim 1 further comprising:
at least one interface ($S_x$), each interface ($S_x$) lying between two neighboring cells, each clocked by a clock signal of consecutive numbering order; and
for each interface ($S_x$), the numbering cycle of the clock signals for the cells lying downstream in the signal-flow path begins with the clock signal differing by w from those clock signals which are applied to the cells lying directly upstream in the signal flow path of the interface, with w being selectable between 1 and W=n−2, and equal to the number of periods of said data rate, appearing per interface, by which the storage time of the FIFO memory is reduced at the respective interface.

5. The improvement of claim 4, wherein only one interface is provided, and that the numbering order difference of the clock signals at this particular interface equals w.

* * * * *